United States Patent
Shimizu et al.

(10) Patent No.: US 9,972,712 B2
(45) Date of Patent: May 15, 2018

(54) SEMICONDUCTOR DEVICE

(71) Applicant: Kabushiki Kaisha Toshiba, Minato-ku (JP)

(72) Inventors: Tatsuo Shimizu, Shinigawa (JP); Ryosuke Iijima, Setagaya (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 16 days.

(21) Appl. No.: 15/252,480

(22) Filed: Aug. 31, 2016

(65) Prior Publication Data
US 2017/0077288 A1  Mar. 16, 2017

(30) Foreign Application Priority Data
Sep. 11, 2015  (JP) .................. 2015-179036

(51) Int. Cl.
| | |
|---|---|
| *H01L 29/78* | (2006.01) |
| *H01L 29/16* | (2006.01) |
| *H01L 29/417* | (2006.01) |
| *H01L 29/66* | (2006.01) |
| *H01L 29/47* | (2006.01) |
| *H01L 21/04* | (2006.01) |

(52) U.S. Cl.
CPC ...... *H01L 29/7806* (2013.01); *H01L 21/0485* (2013.01); *H01L 21/0495* (2013.01); *H01L 29/1608* (2013.01); *H01L 29/41741* (2013.01); *H01L 29/41775* (2013.01); *H01L 29/47* (2013.01); *H01L 29/66068* (2013.01)

(58) Field of Classification Search
None
See application file for complete search history.

(56) References Cited

U.S. PATENT DOCUMENTS

| | | | |
|---|---|---|---|
| 8,299,507 B2 | 10/2012 | Shimizu et al. | |
| 9,234,826 B2* | 1/2016 | Matsubara | ............... G01N 3/34 |
| 2013/0240871 A1 | 9/2013 | Shimoda et al. | |
| 2014/0103364 A1 | 4/2014 | Nakano et al. | |
| 2016/0087045 A1* | 3/2016 | Shimizu | ............... H01L 21/049 |
| | | | 257/77 |

(Continued)

FOREIGN PATENT DOCUMENTS

| | | |
|---|---|---|
| JP | 2000-106428 A | 4/2000 |
| JP | 2010-212361 A | 9/2010 |
| JP | 2011-238714 A | 11/2011 |

(Continued)

OTHER PUBLICATIONS

U.S. Appl. No. 15/252,432, filed Aug. 31, 2016, Shimizu, et al.
U.S. Appl. No. 15/252,449, filed Aug. 31, 2016, Shimizu et al.

*Primary Examiner* — Abul Kalam
(74) *Attorney, Agent, or Firm* — Oblon, McClelland, Maier & Neustadt, L.L.P.

(57) ABSTRACT

A semiconductor device according to an embodiment includes a conductive region including titanium (Ti), oxygen (O), at least one first element from zirconium (Zr) and hafnium (Hf), and at least one second element from vanadium (V), niobium (Nb), and tantalum (Ta), an n-type first SiC region, a p-type second SiC region provided between the conductive region and the n-type first SiC region, a gate electrode, and a gate insulating layer provided between the conductive region, the p-type second SiC region, the n-type first SiC region, and the gate electrode.

17 Claims, 17 Drawing Sheets

(56) References Cited

U.S. PATENT DOCUMENTS

2017/0077239 A1  3/2017  Shimizu et al.
2017/0077317 A1  3/2017  Shimizu et al.

FOREIGN PATENT DOCUMENTS

| JP | 2014-3051 A | 1/2014 |
|---|---|---|
| JP | 2017-55000 | 3/2017 |
| JP | 2017-55001 | 3/2017 |

* cited by examiner

SEMICONDUCTOR DEVICE

CROSS-REFERENCE TO RELATED APPLICATION

This application is based upon and claims the benefit of priority from Japanese Patent Application No. 2015-179036, filed on Sep. 11, 2015, the entire contents of which are incorporated herein by reference.

FIELD

Embodiments described herein relate generally to a semiconductor device.

BACKGROUND

Silicon carbide (SiC) has attracted attention as a material for the next generation semiconductor device. SiC has excellent properties including a band gap three times, breakdown field strength approximately ten times, and thermal conductivity approximately three times as much as those of silicon (Si). Practically using the properties can achieve a semiconductor device capable of operating at a high temperature with a low loss.

Scaling-down of a transistor is desired in order to improve performance of the semiconductor device.

DETAILED DESCRIPTION

A semiconductor device according to one embodiment includes a conductive region including titanium (Ti), oxygen (O), at least one first element from zirconium (Zr) and hafnium (Hf), and at least one second element from vanadium (V), niobium (Nb), and tantalum (Ta), an n-type first SiC region, a p-type second SiC region provided between the conductive region and the n-type first SiC region, a gate electrode, and a gate insulating layer provided between the conductive region, the p-type second SiC region, the n-type first SiC region, and the gate electrode.

Embodiments of the present disclosure will be described below with reference to the drawings. Note that, in the following descriptions, for example, the same members or similar members are denoted with the same reference signs. The descriptions of members, for example, that have been given once, are appropriately omitted.

In the following descriptions, representations of $n^+$, n, $n^-$, and $p^+$, p, $p^-$ give relative high and low levels of impurity concentration in each conductive type. That is, $n^+$ represents n-type impurity concentration relatively higher than that of n. $n^-$ represents n-type impurity concentration relatively lower than that of n.

represents p-type impurity concentration relatively higher than that of p. $p^-$ represents p-type impurity concentration relatively lower than that of p. Note that, in some cases, an $n^+$-type and an $n^-$-type may be simply expressed by an n-type. A $p^+$-type and a $p^-$-type may be simply expressed by a p-type.

First Embodiment

A semiconductor device according to the present embodiment includes a conductive region including titanium (Ti), oxygen (O), at least one first element from zirconium (Zr) and hafnium (Hf), and at least one second element from vanadium (V), niobium (Nb), and tantalum (Ta), an n-type first SiC region, a p-type second SiC region provided between the conductive region and the n-type first SiC region, a gate electrode, and a gate insulating layer provided between the conductive region, the p-type second SiC region, the n-type first SiC region, and the gate electrode.

Figure 1:
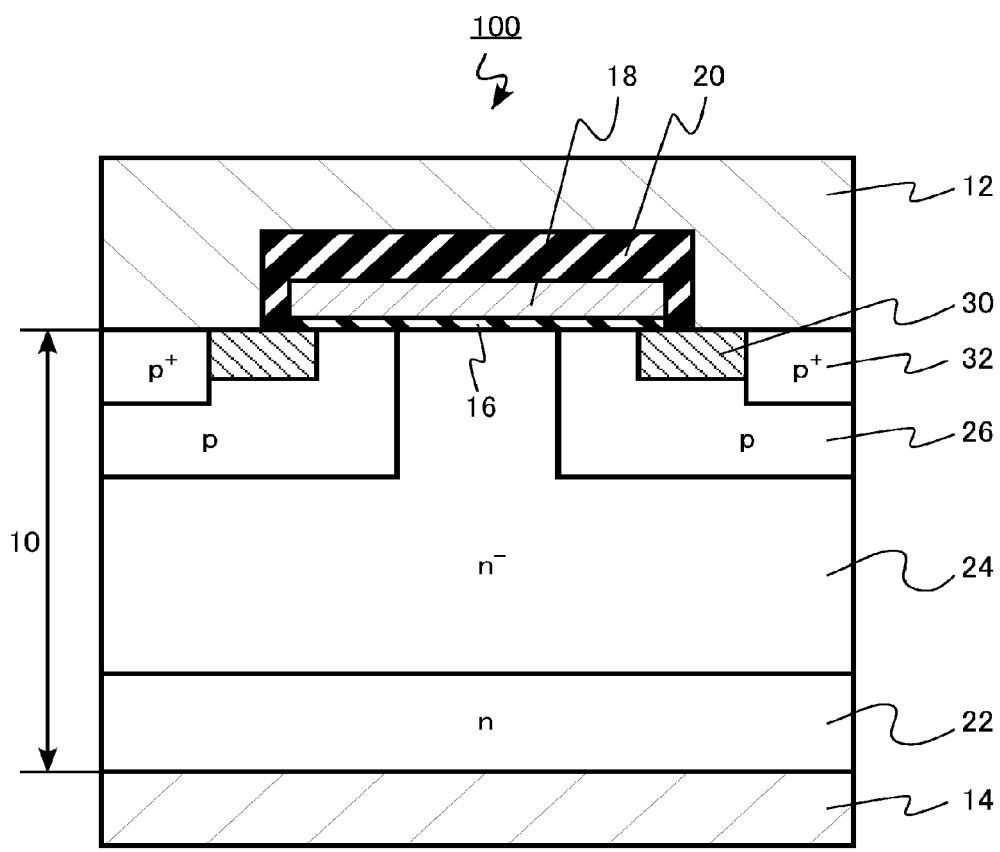
FIG. 1 is a schematic cross-sectional view of a semiconductor device according to a first embodiment.
Figure 2:
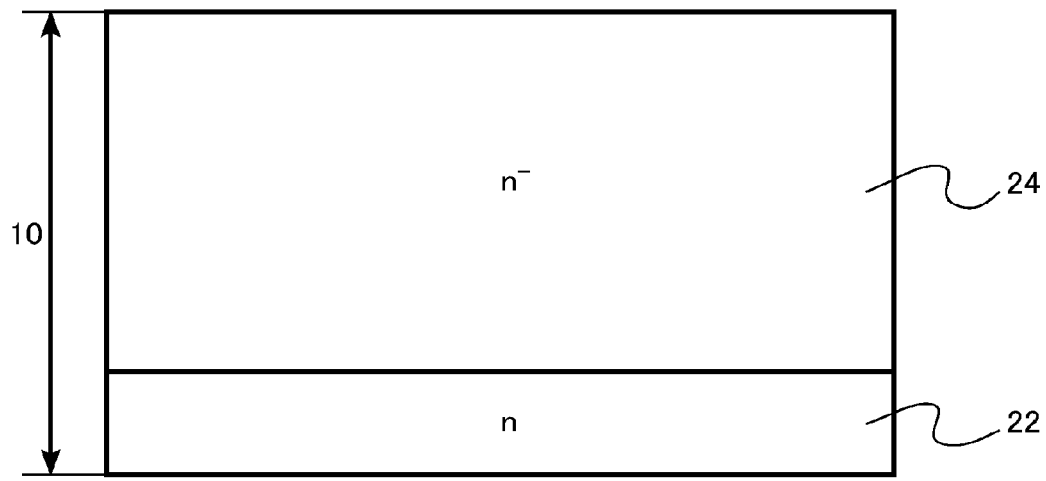
FIG. 2 is a schematic cross-sectional view of the semiconductor device in manufacturing according to the first embodiment.
Figure 3:
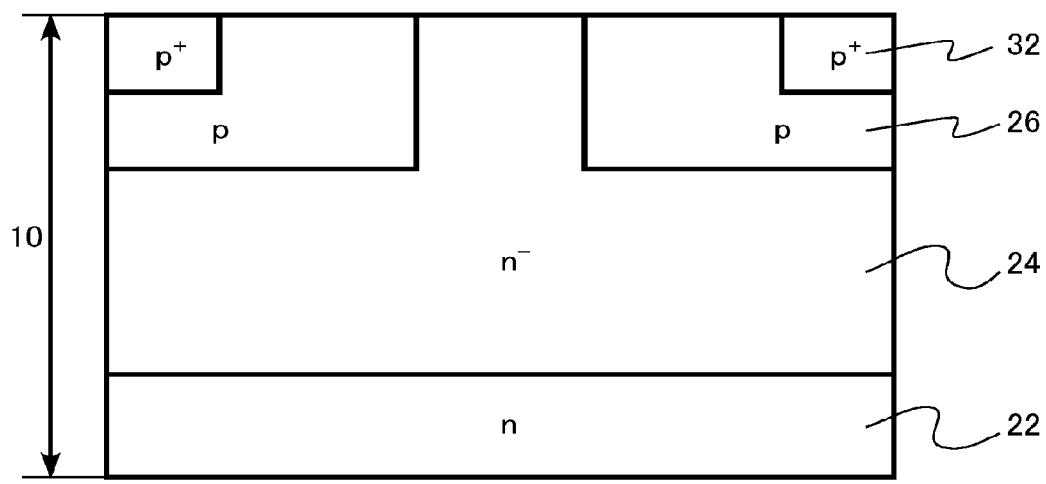
FIG. 3 is a schematic cross-sectional view of the semiconductor device in manufacturing according to the first embodiment.

FIG. 1 is a schematic cross-sectional view of a configuration of a MOSFET that is a semiconductor device according to the present embodiment. The metal oxide semiconductor field effect transistor (MOSFET) 100 is a Schottky junction MOSFET including a source region formed of a metal oxide. The MOSFET 100 is an n-type MOSFET in which an electron serves as a carrier.

The MOSFET 100 includes an SiC layer 10, a source electrode 12, a drain electrode 14, the gate insulating layer 16, the gate electrode 18, and an interlayer insulating film 20. The SiC layer 10 includes a drain region 22, a drift region (n-type first SiC region) 24, a well region (p-type second SiC region) 26, a source region (conductive region) 30, and a well contact region (p-type third SiC region) 32.

The SiC layer 10 is SiC having a crystal structure of 4H-SiC. The 4H-SiC is a hexagonal crystal system.

The SiC layer 10 has a first plane and a second plane. In FIG. 1, the first plane is a plane on the upper side of the figure. The second plane is a plane on the lower side of the figure. Hereinafter, the first plane is referred to as a front surface. The second plane is referred to as a back surface.

A case where the first plane has inclined at an angle of 0 to 8 degrees to a (0001) face and the second plane has inclined at an angle of 0 to 8 degrees to a (000-1) face, will be described as an example. The (0001) face is referred to as a silicon face. The (000-1) face is referred to as a carbon face.

The drain region 22 is n-type SiC. The drain region 22 contains, for example, nitrogen (N) as an n-type impurity. Concentration of the n-type impurity in the drain region 22 is, for example, in a range from $1 \times 10^{12}$ cm$^{-3}$ to $1 \times 10^{21}$ cm$^{-3}$.

In terms of reduction of contact resistance between the drain electrode 14 and the drain region 22, the concentration of the n-type impurity in the second plane of the drain region 22 is preferably $1 \times 10^{19}$ cm$^{-3}$ or more, more preferably, $1 \times 10^{20}$ cm$^{-3}$ or more.

The drift region 24 is provided on the drain region 22. The drift region 24 is, for example, n$^-$-type SiC formed on the drain region 22 by epitaxial growth. The thickness of the drift region 24 is, for example, in a range from 5 μm to 150 μm.

The drift region 24 contains, for example, nitrogen (N) as an n-type impurity. Concentration of the n-type impurity in the drift region 24 is, for example, in a range from $5 \times 10^{15}$ cm$^{-3}$ to $2 \times 10^{16}$ cm$^{-3}$.

The well region 26 is provided on the drift region 24. The well region 26 is p-type SiC. The well region 26 is provided between a source region 30 and the drift region 24. The well region 26 functions as a channel region of the MOSFET 100.

The well region 26 contains, for example, aluminum (Al) as a p-type impurity. Concentration of the p-type impurity in the well region 26 is in a range from $5 \times 10^{15}$ cm$^{-3}$ to $1 \times 10^{17}$ cm$^{-3}$. The depth of the well region 26 is, for example, in a range from 0.4 μm to 0.8 μm.

The source region 30 is provided in the well region 26. The source region 30 contains titanium (Ti) and oxygen (O). The source region 30 also contains zirconium (Zr) or hafnium (Hf). The source region 30 also contains at least one impurity element selected from the group consisting of vanadium (V), niobium (Nb), and tantalum (Ta).

The source region 30 is a metal oxide that has been metalized. The source region 30 is, for example, a titanium oxide. The source region 30 is, for example, (Ti, Zr, Hf)O$_2$. The source region 30 is polycrystalline or amorphous.

An atomic ratio of the titanium to the sum of the titanium, the zirconium, and the hafnium in the source region 30 (Ti/(Ti+Zr+Hf)) is preferably in a range from 0.5 to 0.8, more preferably, in a range from 0.6 to 0.7.

Adding the impurity element to the metal oxide causes the metal oxide to include conductivity. For example, the titanium (Ti), the zirconium (Zr), or the hafnium (Hf) is substituted. The vanadium (V), the niobium (Nb), or the tantalum (Ta) to be an n-type impurity is added to the metal oxide. As a result, the metal oxide has n-type conductivity in which an electron serves as a carrier.

Concentration of the impurity element in the source region 30 is, for example, in a range from $1 \times 10^{18}$ cm$^{-3}$ to $1 \times 10^{21}$ cm$^{-3}$. In terms of metallization of the source region 30, the concentration of the impurity element in the source region 30 is preferably $1 \times 10^{19}$ cm$^{-3}$ or more, more preferably, $1 \times 10^{20}$ cm$^{-3}$ or more.

A type of the element, an amount of the element, an atomic ratio of the element contained in the source region 30 can be identified by secondary ion mass spectrometry (SIMS).

The depth of the source region 30 (film thickness) is shallower than that of the well region 26, and is, for example, in a range from 0.02 μm to 0.1 μm. The depth of the source region 30 (film thickness) is shallower than that of the well contact region 32.

The well contact region 32 is provided in the well region 26. The well contact region 32 is provided on the side of the source region 30.

The well contact region 32 is p$^+$-type SiC. The well contact region 32 contains, for example, aluminum (Al) as a p-type impurity. Concentration of the p-type impurity in the well contact region 32 is, for example, in a range from $1 \times 10^{18}$ cm$^+$ to $1 \times 10^{11}$ cm$^{-3}$.

The depth of the well contact region 32 is shallower than that of the well region 26, and is, for example, in a range from 0.2 μm to 0.4 μm. The depth of the well contact region 32 is deeper than that of the source region 30 (film thickness).

The gate insulating layer 16 is formed on the source region 30, the well region 26, and the drift region 24. The gate insulating layer 16 is formed between the source region 30, the well region 26, the drift region 24, and the gate electrode 18. For example, a silicon oxide film or a high-k insulating film can be applied to the gate insulating layer 16.

The gate electrode 18 is provided on the gate insulating layer 16. For example, polycrystalline silicon doped with an impurity can be applied to the gate electrode 18. For example, a metal semiconductor compound or a metal can be also applied to the gate electrode 18.

The interlayer insulating film 20 is provided on the gate electrode 18. The interlayer insulating film 20 is, for example, a silicon oxide film.

The well region 26 interposed between the source region 30 and the drift region 24 below the gate electrode 18, functions as a channel region of the MOSFET 100.

The source electrode 12 is provided on the front surface of the SiC layer 10. The source electrode 12 is electrically coupled to the source region 30 and the well contact region 32. The source electrode 12 is in contact with the well contact region 32 and the source region 30. The source electrode 12 also has a function for applying potential to the well region 26.

The source electrode 12 is a metal. The metal that forms the source electrode 12 has, for example, a layered structure including titanium (Ti) and aluminum (Al). The metal that forms the source electrode 12 may react with the SiC layer 10 so as to form a metal silicide or a metal carbide.

The drain electrode 14 is provided on the back surface of the SiC layer 10. The drain electrode 14 is electrically coupled to the drain region 22.

The drain electrode 14 is a metal. The metal that forms the drain electrode 14 is, for example, a nickel silicide (NiSi)

Next, a method of manufacturing the semiconductor device according to the present embodiment, will be described. FIGS. 2 to 6 are schematic cross-sectional views of the semiconductor device that has been being manufactured by the method of manufacturing the semiconductor device according to the present embodiment.

First, an n-type SiC layer (drain region) 22 having a first plane that is a silicon face and a second plane that is a carbon face, is prepared.

Next, an n$^-$-type drift region 24 is formed on the first plane of the n-type SiC layer (drain region) 22 by epitaxial growth. An SiC layer 10 includes the n-type SiC layer 22 and the n$^-$-type drift region 24 (refer to FIG. 2).

Next, ion implantation of aluminum (Al) that is a p-type impurity is selectively performed to the drift region 24 by photolithography and an ion implantation method. The ion implantation forms a well region 26 and a well contact region 32 (refer to FIG. 3).

Next, annealing for activating the p-type impurity is performed. The activation annealing is performed, for example, at a temperature of 1700° C. to 1900° C. in an inert gas atmosphere.

Figure 4:
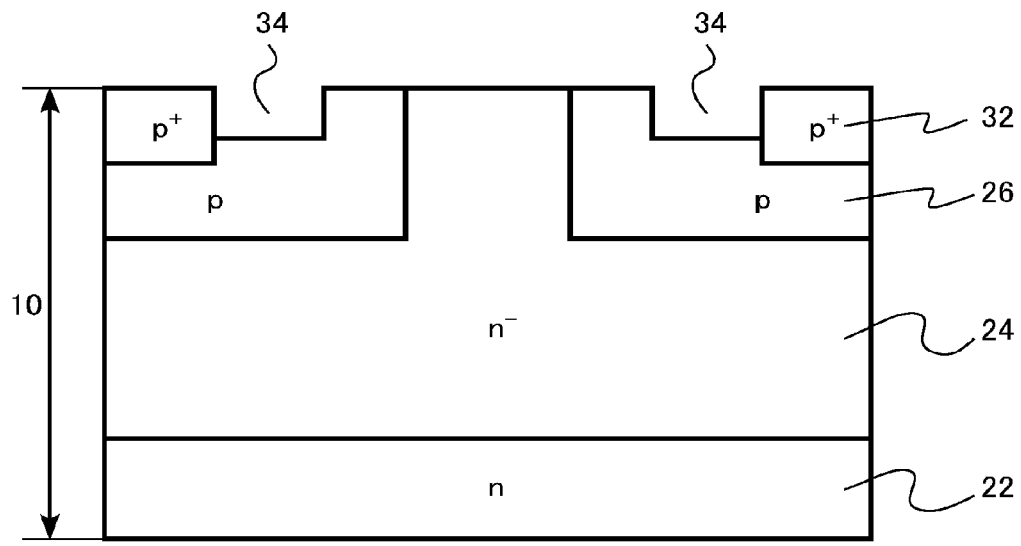
FIG. 4 is a schematic cross-sectional view of the semiconductor device in manufacturing according to the first embodiment.

Next, a groove 34 is formed on a front surface of the SiC layer 10 using patterning by photolithography and etching (refer to FIG. 4).

Figure 5:
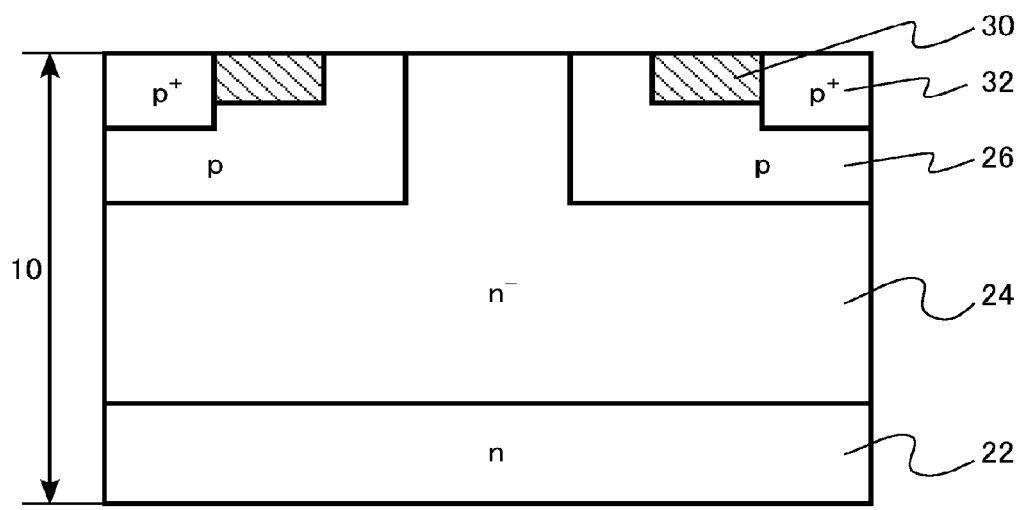
FIG. 5 is a schematic cross-sectional view of the semiconductor device in manufacturing according to the first embodiment.

Next, a source region 30 is formed in the groove 34 (refer to FIG. 5). The source region 30 is, for example, a titanium oxide that contains niobium (Nb) as an impurity element, and that contains zirconium. For example, the groove 34 is filled with the titanium oxide by a sputtering method at temperature of 400° C. or less. In this case, the inside of the groove becomes amorphous. After that, crystallization annealing at a temperature of 600° C. to 800° C. may be performed. A CVD method may grow a film with excellent coverage. Then, crystallization annealing may be performed so as to form a polycrystalline film. In this case, the film is formed so as to be columnar in a direction of the film thickness. When a layered structure Including two amorphous films or more each having a different column size, is formed, uniformity of an electrical characteristic of a film including the two polycrystalline films or more increases in a surface of the film. The layered structure including columns each having a different size, can be achieved by performing deposition a plurality of times as deposition, crystallization, deposition (in a condition at a different temperature), and crystallization in this order are performed. In this case, uniformity of electric current in the surface can be improved. Thus, the electric current that flows through a channel, becomes uniform. This point is substantially the same in the following embodiment. After that, for example, the titanium oxide on the front surface of the SiC layer 10 is removed by a chemical mechanical polishing (CMP) method.

Figure 6:
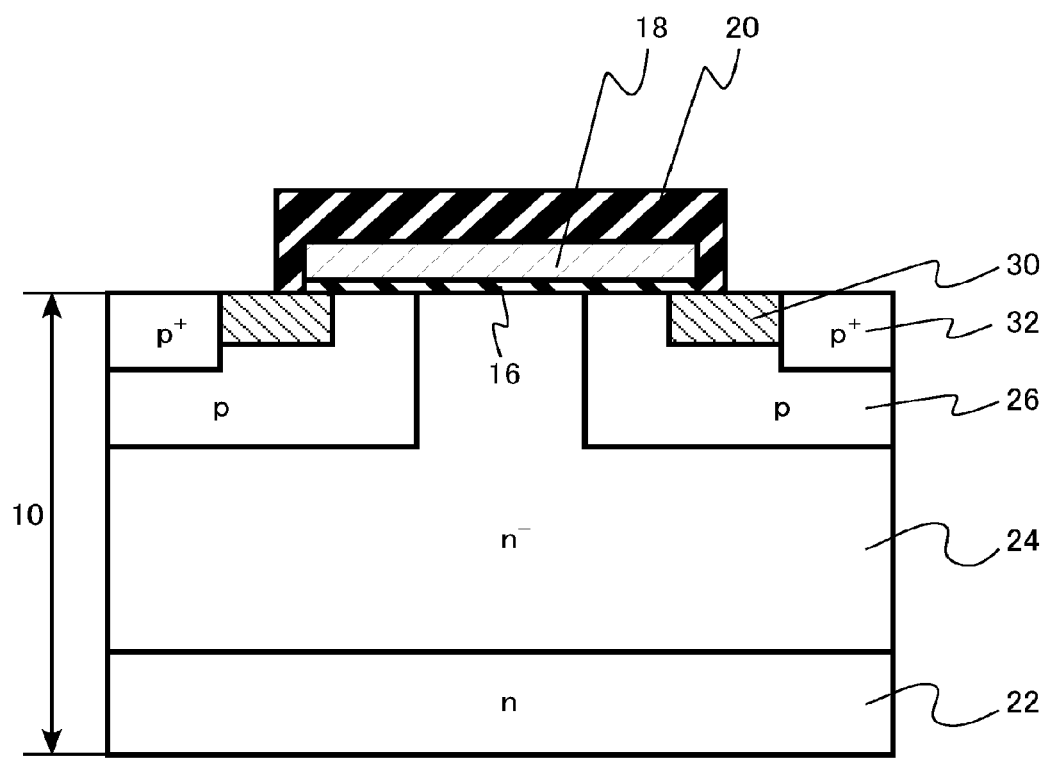
FIG. 6 is a schematic cross-sectional view of the semiconductor device in manufacturing according to the first embodiment.

Next, the gate insulating layer 16, the gate electrode 18, and the interlayer insulating film 20 are formed on the front surface of the SiC layer 10 by a known process technique (refer to FIG. 6). The gate insulating layer 16 is, for example, a silicon oxide film formed by a chemical vapor deposition (CVD) method. The gate electrode 18 is, for example, polycrystalline silicon that has been doped, formed by the CVD method. The interlayer insulating film 20 is, for example, a silicon oxide film formed by the CVD method.

Next, a source electrode 12 is formed on the source region 30 and the well contact region 32. The source electrode 12 is formed by, for example, sputtering using titanium (Ti) and aluminum (Al).

Next, a drain electrode 14 is formed on a back surface of the SiC layer 10. The drain electrode 14 is formed by, for example, sputtering using a nickel silicide (NiSi).

A MOSFET 100 illustrated in FIG. 1 is formed by the above manufacturing method.

A function and an effect of the semiconductor device according to the present embodiment will be described below.

A method of applying a metal to a source region or a drain region is provided as a technique for scaling down a MOSFET. A MOSFET in which a metal has been applied to a source region or a drain region, is referred to as a Schottky junction MOSFET.

In the Schottky junction MOSFET, the source region or the drain region that is shallow and has low resistance can be formed. Accordingly, on-state current increases and a short channel effect is inhibited. Therefore, a minute and high-performance MOSFET can be achieved.

In order to achieve an n-type SiC Schottky junction MOSFET, there is preferably a sufficient height of an energy barrier between the source region and a p-type SiC channel region in an off-state of the MOSFET. An energy barrier between the source region and an inversion layer that has been formed in the p-type SiC channel region, is preferably made to decrease in an on-state of the MOSFET.

The inversion layer that has been formed in the p-type SiC channel region, is considered to be an n-type region. In order to decrease the energy barrier between the source region and the n-type inversion layer, a work function of the metal that forms the source region is preferably close to electron affinity of the SiC in the on-state of the MOSFET. In order to eliminate the energy barrier between the source region and the n-type inversion layer, the work function of the metal that forms the source region is preferably equal to or less than the electron affinity of the SiC.

Note that a work function is defined as an energy difference between a vacuum level (energy level of vacuum) and a Fermi level of a substance to be an object. Electron affinity is defined as a difference between the vacuum level (energy level of vacuum) and an energy level at a lower end of a conduction band of the substance to be an object.

When the substance to be an object is 4H-SiC, the electron affinity is 3.60 eV. Therefore, applying a metal having a work function close to 3.60 eV to the metal that forms the source region, can achieve the n-type SiC Schottky junction MOSFET. Furthermore, applying a metal having a work function of 3.60 eV or less to the metal that forms the source region, the energy barrier between the source region and the n-type inversion layer disappears. Thus, a further high-performance n-type SiC Schottky junction MOSFET can be achieved.

However, the metal having a work function close to 3.60 eV has low oxidation resistance and low humidity resistance. Therefore, there is no metal suitable to a material for a source region of a transistor.

Figure 7:
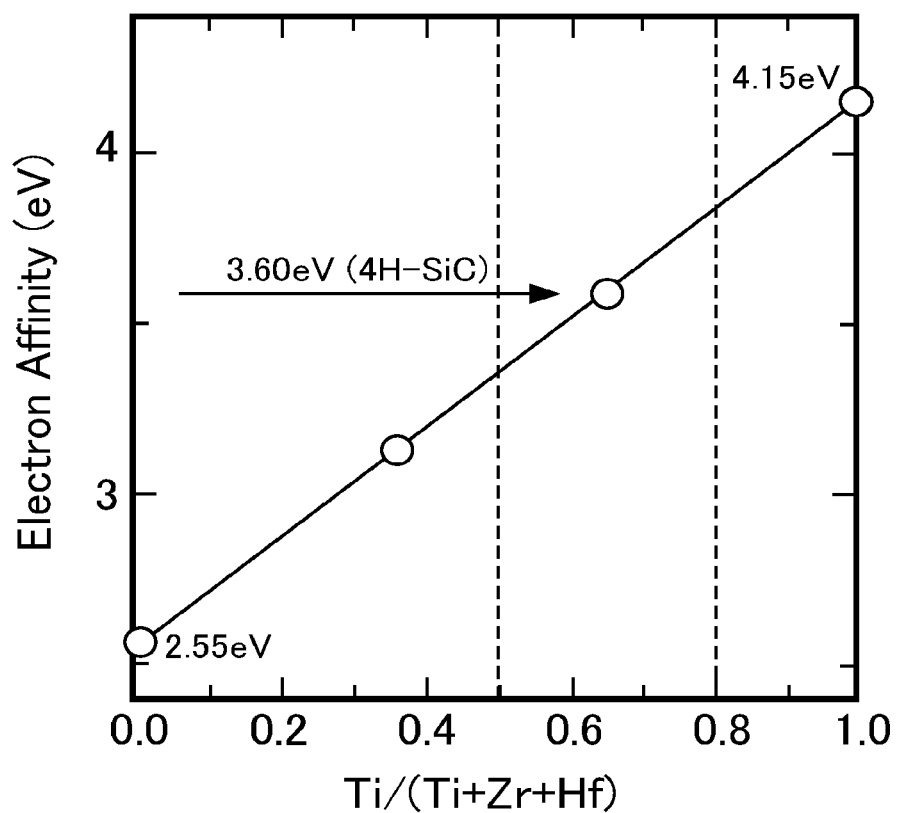
FIG. 7 is a graphical representation of a function and an effect of the semiconductor device according to the first embodiment.
Figure 8:
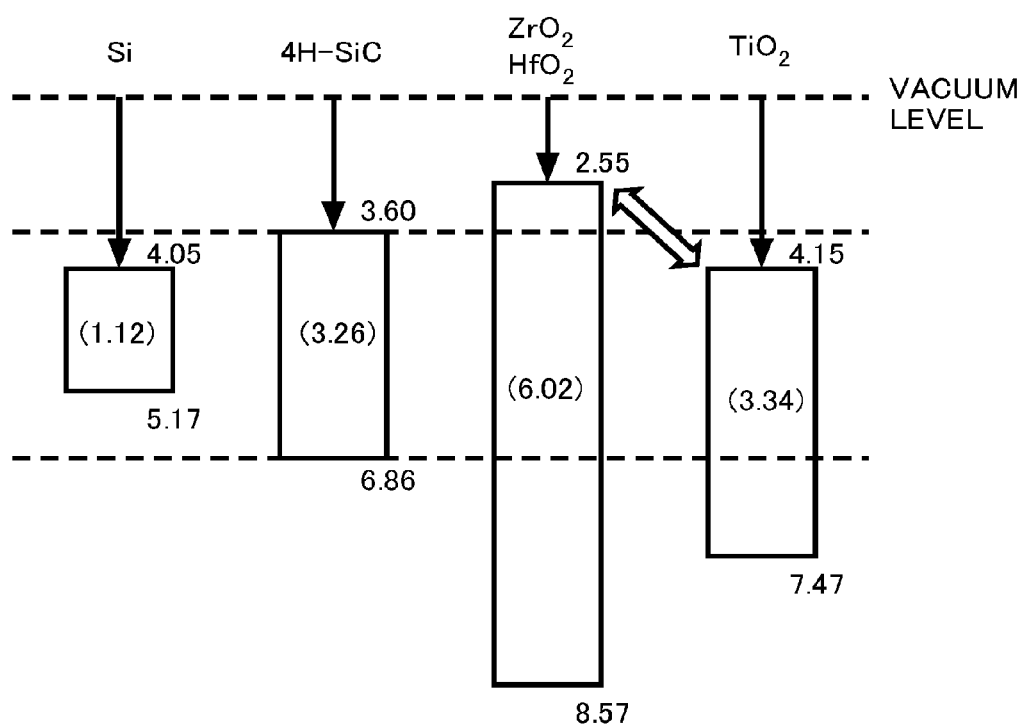
FIG. 8 is a graphical representation of the function and the effect of the semiconductor device according to the first embodiment.

FIGS. 7 and 8 are graphical representations of a function and an effect of the semiconductor device according to the present embodiment.

FIG. 7 is a graphical representation of a change of electron affinity of the titanium oxide in a case where the zirconium (Zr) or the hafnium (Hf) has been added to the titanium oxide. The electron affinity is calculated by using a first principles calculation. Note that, in a case where an n-type impurity is introduced into the titanium oxide so as to perform metallization, it can be assumed that a Fermi level corresponds to an energy level at a lower end of a conduction band of the titanium oxide.

Therefore, it can be assumed that a work function corresponds to the electron affinity.

FIG. 8 is a graphical representation of energy band structures of silicon (Si), 4H-SiC, a zirconium oxide ($ZrO_2$), a hafnium oxide ($HfO_2$), and a titanium oxide ($TiO_2$).

An energy difference between the vacuum level and a lower end of a conduction band of each of the materials (electron affinity), an energy difference between the vacuum level and an upper end of a valence band of each of the materials, and a band gap energy of each of the materials, are illustrated. In the figure, a numerical value in brackets for each of the materials indicates the band gap energy.

As illustrated in FIG. 7, a result of the first principles calculation by the inventors clearly shows that the electron affinity changes so as to decrease by adding the zirconium (Zr) or the hafnium (Hf) to the titanium oxide. In a case where no zirconium (Zr) or no hafnium (Hf) is added, namely, in a case of the titanium oxide, the electron affinity is 4.15 eV. In contrast, in a case where the zirconium (Zr) or the hafnium (Hf) is substituted for all titanium (Ti) of the titanium oxide, namely, in a case of a zirconium oxide or a hafnium oxide, the electron affinity decreases to 2.55 eV.

As illustrated in FIG. 8, adding the zirconium (Zr) or the hafnium (Hf) to the titanium oxide can set the electron affinity to an arbitrary value between 2.55 eV to 4.15 eV indicated by a white arrow. In other words, changing an atomic ratio of the titanium to the sum of the titanium, the zirconium, and the hafnium (Ti/(Ti+Zr+Hf)) in (Ti, Zr, Hf)$O_2$ can set the electron affinity to the arbitrary value between 2.55 eV to 4.15 eV indicated by the white arrow. In particular, when Ti/(Ti+Zr+Hf)=0.64 is satisfied, the electron affinity can correspond to 3.60 eV that is a value of electron affinity of the 4H-SiC.

According to the present embodiment, in the source region 30, the zirconium (Zr) or the hafnium (Hf) is added to a metal oxide including titanium. Accordingly, the work function decreases when compared to that in a case where the metal oxide contains no zirconium (Zr) or hafnium (Hf).

Therefore, the work function of the source region 30 can come close to 3.60 eV that is the value of electron affinity of the 4H-SiC. Therefore, the n-type SiC Schottky junction MOSFET 100 can be achieved.

Note that, in the off-state of the MOSFET 100, the energy barrier between the source region and the p-type SiC channel region becomes a band gap energy of the 4H-SiC. Since the band gap energy of the 4H-SiC is 3.26 eV, a sufficient energy barrier for cutting off the MOSFET 100 is provided.

In the on-state of the MOSFET, in terms of a decrease of the energy barrier between the source region 30 and the inversion layer formed in the p-type SiC channel region, the atomic ratio of the titanium to the sum of the titanium, the zirconium, and the hafnium (Ti/(Ti+Zr+Hf)) in the source region 30 is, preferably, 0.8 or less, more preferably, 0.7 or less, and, even more preferably, 0.64 or less.

In the on-state of the MOSFET, in terms of the source region 30 and the inversion layer formed in the p-type SiC channel region each that have an ohmic characteristic, the atomic ratio of the titanium to the sum of the titanium, the zirconium, and the hafnium (Ti/(Ti+Zr+Hf)) in the source region 30 is, preferably, 0.5 or more, more preferably, 0.6 or more.

Note that, when the atomic ratio (Ti/(Ti+Zr+Hf)) is in a range from 0.5 to 0.8, the work function of the source region 30 can be included in a range of 3.60 eV±10%.

As described above, according to the present embodiment, the metal oxide that has been metalized is applied to the source region 30. Thus, the minute and high performance n-type SiC Schottky junction MOSFET 100 can be achieved.

Further, contacts of the source electrode 12, each having low contact resistance, can be achieved with respect to the source region 30 and the p'-type well contact region 32. The contact between the source region 30 and the source electrode 12, includes two pieces of metal in contact with each other. Accordingly, a metal material that forms the source electrode 12 can be selected without taking the contact resistance with respect to the source region 30 into consideration. Therefore, a material capable of reducing the contact resistance with respect to the well contact region 32, may be selected as the metal material for the source electrode 12.

According to the present embodiment, the source region 30 can be formed of a deposited film. Therefore, the depth of the source region 30 can be shallower than that in a case where the source region 30 is formed by the ion implantation. For example, the depth of the source region 30 can be made shallower than that of the well contact region 32 formed by the ion implantation. In terms of this point, the minute and high-performance n-type SiC Schottky junction MOSFET 100 can be achieved.

Second Embodiment

A semiconductor device according to the present embodiment includes a conductive region including titanium (Ti), oxygen (O), at least one first element from zirconium (Zr) and hafnium (Hf), at least one metal element from calcium (Ca), strontium (Sr), and barium (Ba), and at least one second element from vanadium (V), niobium (Nb), tantalum (Ta), scandium (Sc), yttrium (Y), and lanthanoid, an n-type first SiC region, a p-type second SiC region provided between the conductive region and the n-type first SiC region, a gate electrode, and a gate insulating layer provided between the conductive region, the p-type second SiC region, the N-type first SiC region, and the gate electrode.

The semiconductor device according to the present embodiment has a point that the source region contains at least one element selected from the group consisting of calcium (Ca), strontium (Sr), and barium (Ba), and another point that an element contained in the conductive region is different from that according to the first embodiment. Except the two points, the semiconductor device according to the present embodiment is similar to that according to the first embodiment. Therefore, the descriptions of details that duplicate with respect to the first embodiment, will be omitted.

The semiconductor device according to the present embodiment is a MOSFET. The MOSFET according to the present embodiment will be described with reference to FIG. 1.

A source region 30 contains at least one metal element selected from the group consisting of calcium (Ca), strontium (Sr), and barium (Ba). The source region 30 also contains titanium (Ti) and oxygen (O). The source region 30 also contains zirconium (Zr) or hafnium (Hf). The source region 30 also contains at least one impurity element selected from the group consisting of vanadium (V), niobium (Nb), tantalum (Ta), scandium (Sc), yttrium (Y), and a lanthanoid.

The source region 30 is a metal oxide that has been metalized. The source region 30 is, for example, calcium titanate, strontium titanate, barium titanate, or a composite thereof. The source region 30 is, for example, (Ca, Sr, Ba)(Ti, Zr, Hf)O$_3$ having a perovskite structure. The source region 30 is polycrystalline or amorphous.

An atomic ratio of the titanium to the sum of the titanium, the zirconium, and the hafnium in the source region 30 (Ti/(Ti+Zr+Hf)) is preferably in a range from 0.5 to 0.8, more preferably, in a range from 0.6 to 0.7.

Adding the impurity element to the metal oxide causes the metal oxide to include conductivity. For example, the titanium (Ti), the zirconium (Zr), or the hafnium (Hf) is substituted. The vanadium (V), the niobium (Nb), or the tantalum (Ta) to be an n-type impurity is added to the metal oxide. As a result, the metal oxide has n-type conductivity in which an electron serves as a carrier. For example, the calcium (Ca), the strontium (Sr), or barium (Ba) is substituted. The scandium (Sc), yttrium (Y), or the lanthanoid to be an n-type impurity is added to the metal oxide. As a result, the metal oxide has n-type conductivity in which an electron serves as a carrier. Note that examples of the lanthanoid include lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

Concentration of the impurity element in the source region 30 is, for example, in a range from $1\times10^{19}$ cm$^{-3}$ to $1\times10^{21}$ cm$^{-3}$.

In terms of metallization of the source region 30, the concentration of the impurity element in the source region 30 is preferably $1\times10^{19}$ cm$^{-3}$ or more, more preferably, $1\times10^{20}$ cm$^{-3}$ or more.

A type of the element, an amount of the element, an atomic ratio of the element contained in the source region 30 can be identified by secondary ion mass spectrometry (SIMS).

The depth of the source region 30 (film thickness) is shallower than that of the well region 26, and is, for example, in a range from 0.02 μm to 0.1 μm.

A function and an effect of the semiconductor device according to the present embodiment will be described below.

In the MOSFET according to the present embodiment, the source region 30 contains the metal oxide containing titanium, added with the zirconium (Zr) or the hafnium (Hf) in a manner similar to the first embodiment. Accordingly, a work function of the metal oxide decreases when compared to that of the metal oxides containing no zirconium (Zr) or hafnium (Hf). An effect of decreasing the work function is also achieved in a case where the metal oxide contains calcium (Ca), strontium (Sr), or barium (Ba). Therefore, an n-type SiC Schottky junction MOSFET can be achieved.

Figure 9:
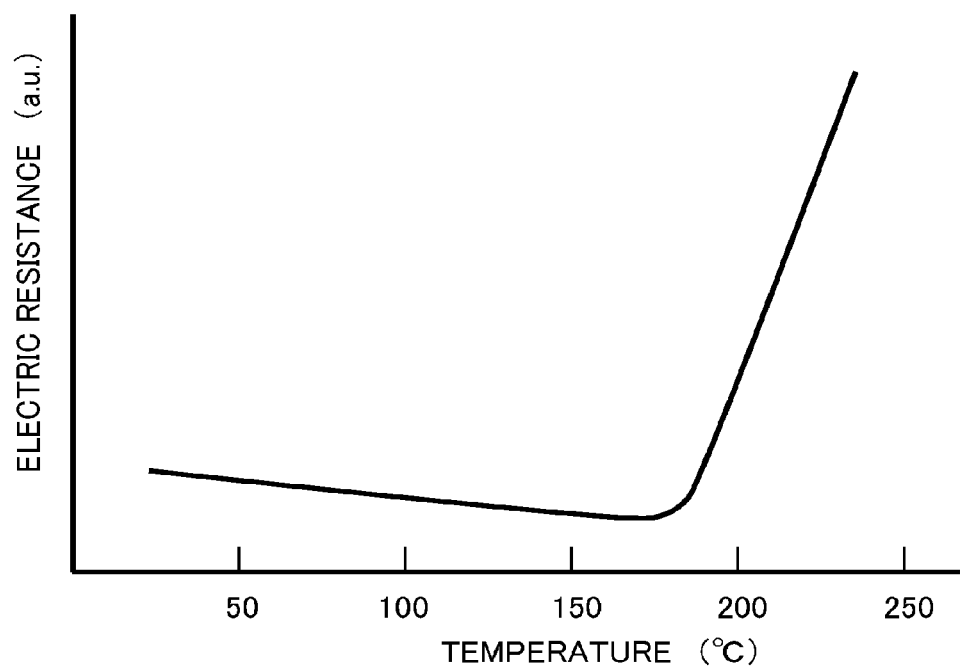
FIG. 9 is a graphical representation of a function and an effect of a semiconductor device according to a second embodiment.

FIG. 9 is a graphical representation of a function and an effect of the semiconductor device according to the present embodiment. FIG. 9 is a graphical representation of temperature dependence of electric resistance of the source region 30 according to the present embodiment.

The source region 30 according to the present embodiment is, for example, calcium titanate, strontium titanate, or barium titanate. As illustrated in FIG. 9, the calcium titanate, the strontium titanate, the barium titanate, and a composite thereof each have a property in which the temperature dependence of electric resistance changes from negative dependence to positive dependence. In other words, the source region 30 according to the present embodiment is a positive temperature coefficient resistor (PTCR) having a positive temperature coefficient in a high temperature region.

For example, in a case where excessive current flows in the MOSFET, there is a risk that the MOSFET is destroyed due to heat generated by the excessive current.

The MOSFET according to the present embodiment includes the source region 30 that is the PTCR. Therefore, when the excessive current flows so as to generate the heat, the electric resistance of the source region 30 increases. Thus, current that flows in the MOSFET is inhibited and destruction of the MOSFET due to the excessive current is inhibited.

The electric resistance of the source region 30 preferably does not have the temperature dependence or preferably has the negative temperature dependence in order to prevent on-state current of the MOSFET from decreasing in an operating temperature region of the MOSFET. Before the MOSFET is destroyed due to a temperature rise, the temperature dependence of the electric resistance of the source region 30 preferably changes to the positive dependence. In terms of the above points, the temperature dependence of the electric resistance of the source region 30 preferably changes from the negative dependence to the positive dependence at a temperature of 150° C. to 200° C.

The source region 30 preferably contains lead (Pb). Causing the calcium titanate, the strontium titanate, the barium titanate, and the composite thereof to contain the lead (Pb), can shift a region having the positive temperature coefficient to the high temperature side.

As described above, according to the present embodiment, the minute and high-performance n-type SiC Schottky junction MOSFET can be achieved in a manner similar to the first embodiment. Contacts of a source electrode 12, each having low contact resistance, can be achieved with respect to the source region 30 and a p$^+$-type well contact region 32, in a manner similar to the first embodiment. Furthermore, since the source region 30 is the PTCR, the destruction of the MOSFET due to the excessive current is inhibited.

Third Embodiment

A semiconductor device according to the present embodiment is different from the first embodiment in that the semiconductor device according to the present embodiment includes a metal silicide film provided between a source electrode and a SiC layer. The descriptions of details that duplicate with respect to the first embodiment, will be omitted below.

The semiconductor device according to the present embodiment is a MOSFET. The MOSFET 200 according to the present embodiment will be described with reference to FIG. 10.

The MOSFET 200 includes an SiC layer 10, a source electrode 12, a drain electrode 14, a gate insulating layer 16, a gate electrode 18, and an interlayer insulating film 20. The SiC layer 10 includes a drain region 22, a drift region (n-type first SiC region) 24, a well region (p-type second SiC region) 26, a source region (conductive region) 30, and a well contact region 32.

The metal silicide film 33 is provided between the well contact region 32 and the source electrode 12. The metal silicide film 33 is, for example, a nickel silicide (NiSi). The source electrode 12 is, for example, aluminum (Al).

Next, a method of manufacturing the semiconductor device according to the present embodiment, will be described. FIGS. 11 to 20 are schematic cross-sectional views of the semiconductor device that has been being manufactured by the method of manufacturing the semiconductor device according to the present embodiment.

First, an n-type SiC layer (drain region) 22 having a first plane that is a silicon face and a second plane that is a carbon face, is prepared.

Next, an n$^-$-type drift region 24 is formed on the first plane of the n-type SiC layer (drain region) 22 by epitaxial growth. The SiC layer 10 includes the n-type SiC layer 22 and the n$^-$-type drift region 24 (refer to FIG. 11).

Next, ion implantation of aluminum (Al) that is a p-type impurity is selectively performed to the drift region 24 by photolithography and an ion implantation method. The ion implantation forms the well contact region 32.

Next, a mask member 36 is formed on a front surface of the SiC layer 10. The mask member 36 is formed by, for example, deposition of a silicon oxide film by a CVD method, photolithography, and etching.

Next, the mask member 36 is used as a mask and ion implantation of aluminum (Al) that is a p-type impurity is selectively performed to the drift region 24. The ion implantation forms the well region 26 (refer to FIG. 12).

Figure 13:
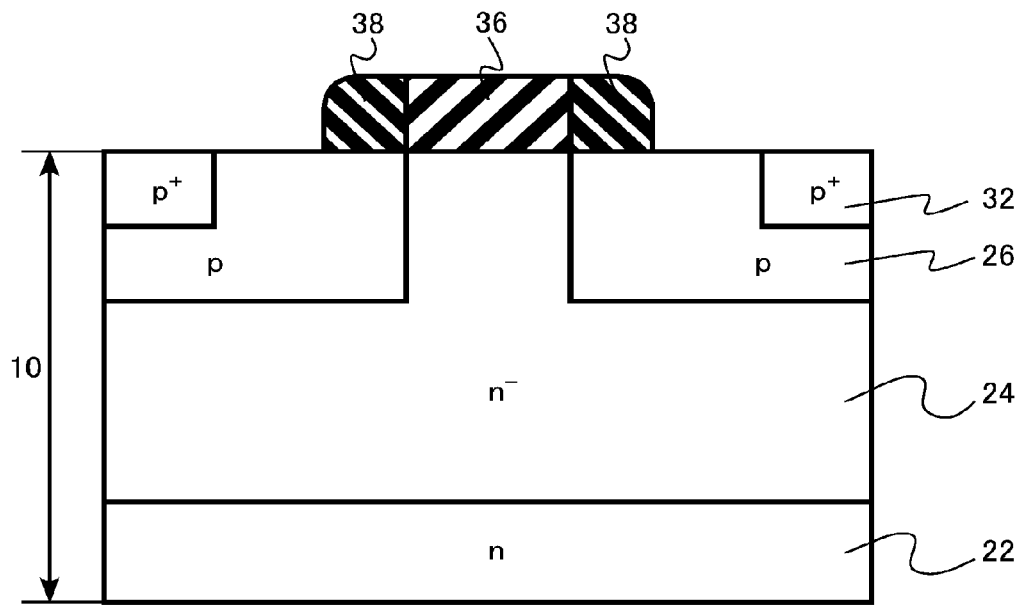
FIG. 13 is a schematic cross-sectional view of the semiconductor device in manufacturing according to the third embodiment.

Next, sidewall members 38 are formed on both sides of the mask member 36 (refer to FIG. 13). The sidewall members 38 are formed by, for example, deposition of a silicon oxide film by a CVD method, and entire plane etching.

Figure 14:
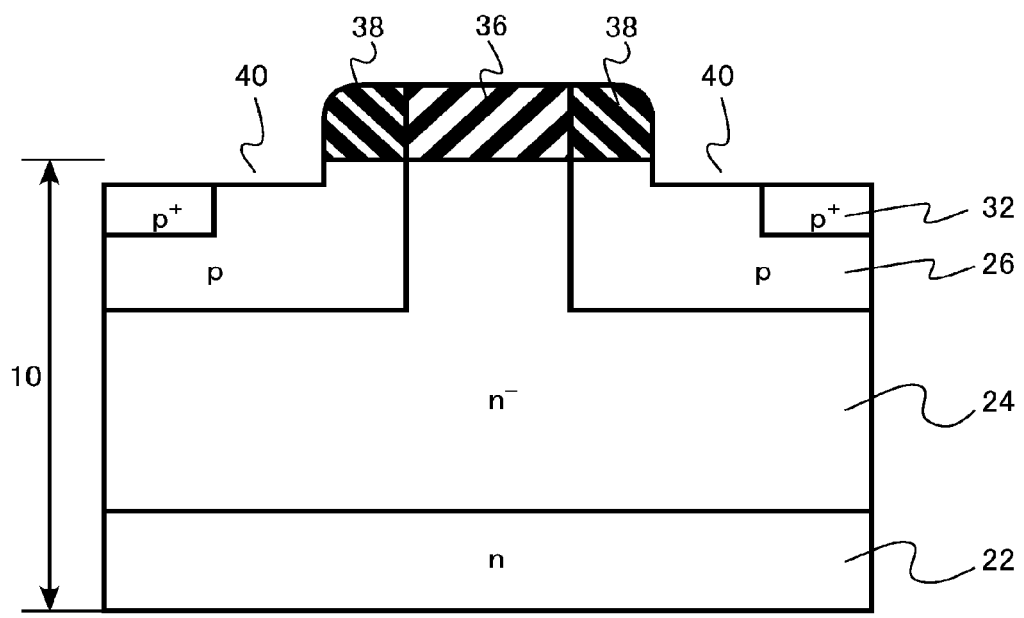
FIG. 14 is a schematic cross-sectional view of the semiconductor device in manufacturing according to the third embodiment.

Next, grooves 40 are formed on the front surface of the SiC layer 10 (refer to FIG. 14). The grooves 40 are formed by performing etching to the SiC layer 10 using the mask member 36 and the sidewall members 38 as masks.

Next, the mask member 36 and the sidewall members 38 are detached. The mask member 36 and the side wall members 38 are detached by, for example, wet etching.

Figure 15:
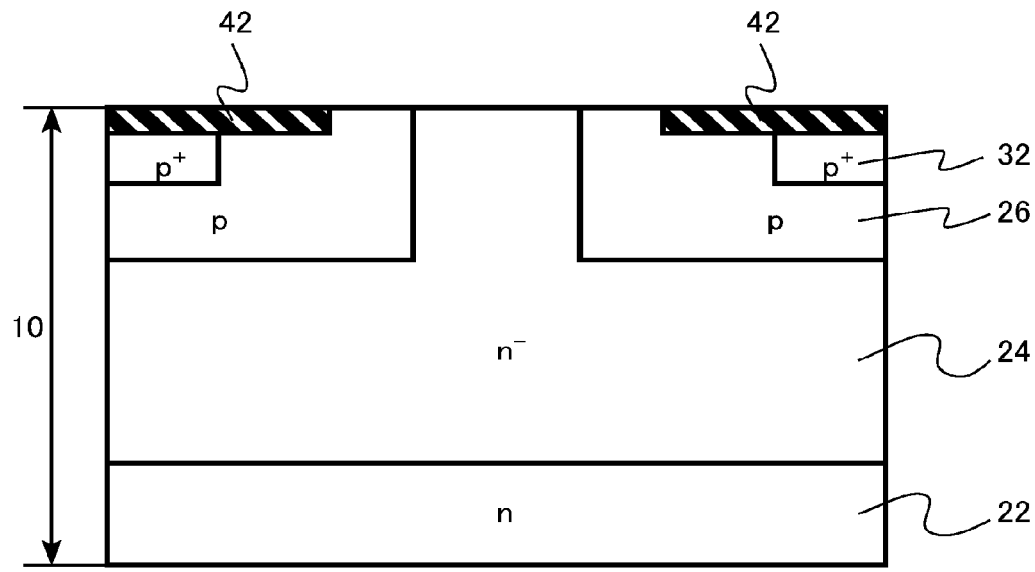
FIG. 15 is a schematic cross-sectional view of the semiconductor device in manufacturing according to the third embodiment.

Next, a sacrificial film 42 is formed on the grooves 40 (refer to FIG. 15). The sacrificial film 42 is formed by, for example, coating of resist, and CMP.

Figure 16:
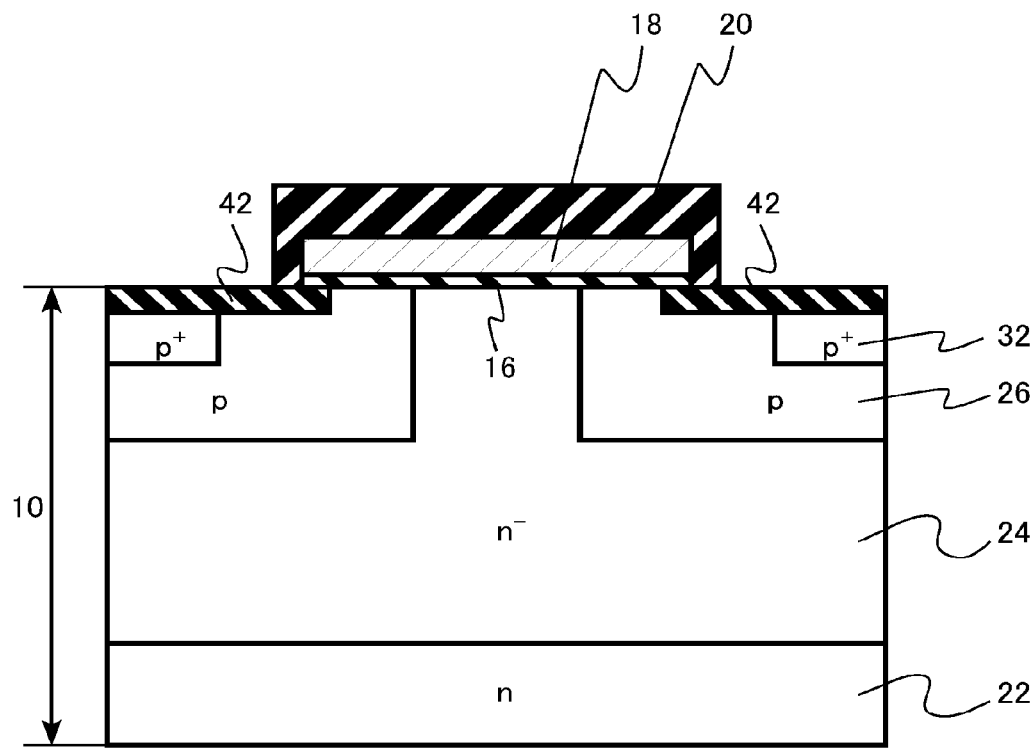
FIG. 16 is a schematic cross-sectional view of the semiconductor device in manufacturing according to the third embodiment.

Next, the gate insulating layer 16, the gate electrode 18, and the interlayer insulating film 20 are formed on the front surface of the SiC layer 10 and front surfaces of the sacrificial films 42 by a known process technique (refer to FIG. 16). The gate insulating layer 16 is, for example, a silicon oxide film formed by a CVD method. The gate electrode 18 is, for example, a metal film formed by a sputtering method. The interlayer insulating film 20 is, for example, a silicon oxide film formed by the CVD method.

Figure 17:
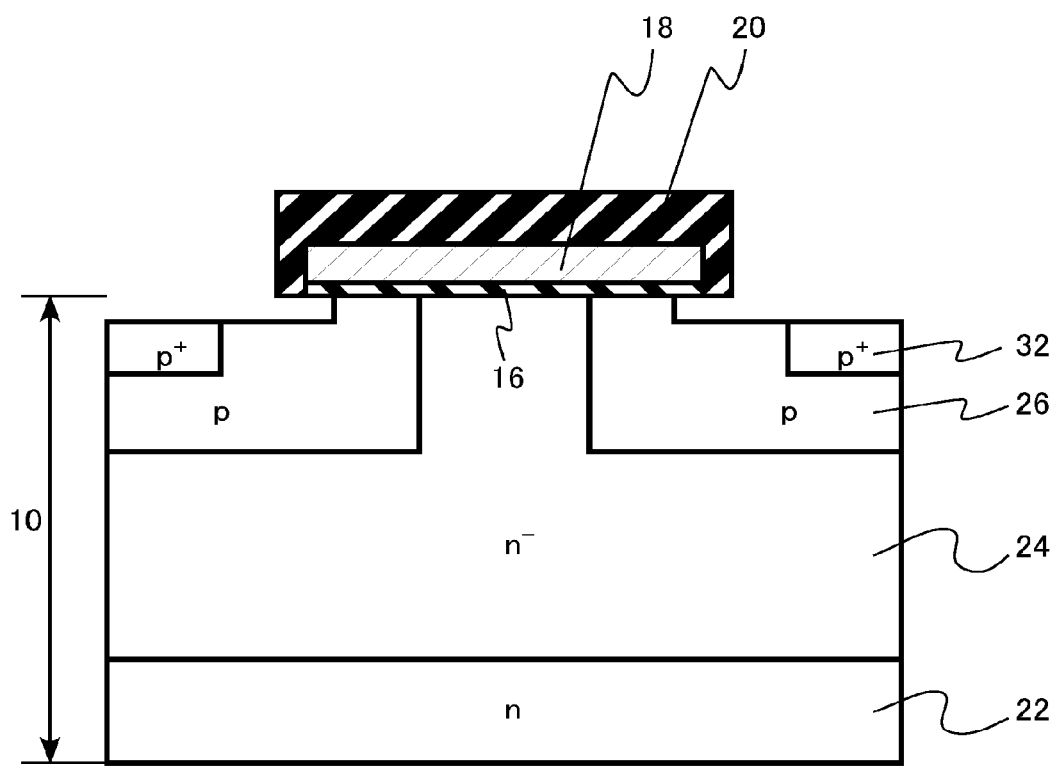
FIG. 17 is a schematic cross-sectional view of the semiconductor device in manufacturing according to the third embodiment.

Next, the sacrificial films 42 are selectively removed (refer to FIG. 17). The sacrificial films 42 are removed by, for example, asking.

Figure 18:
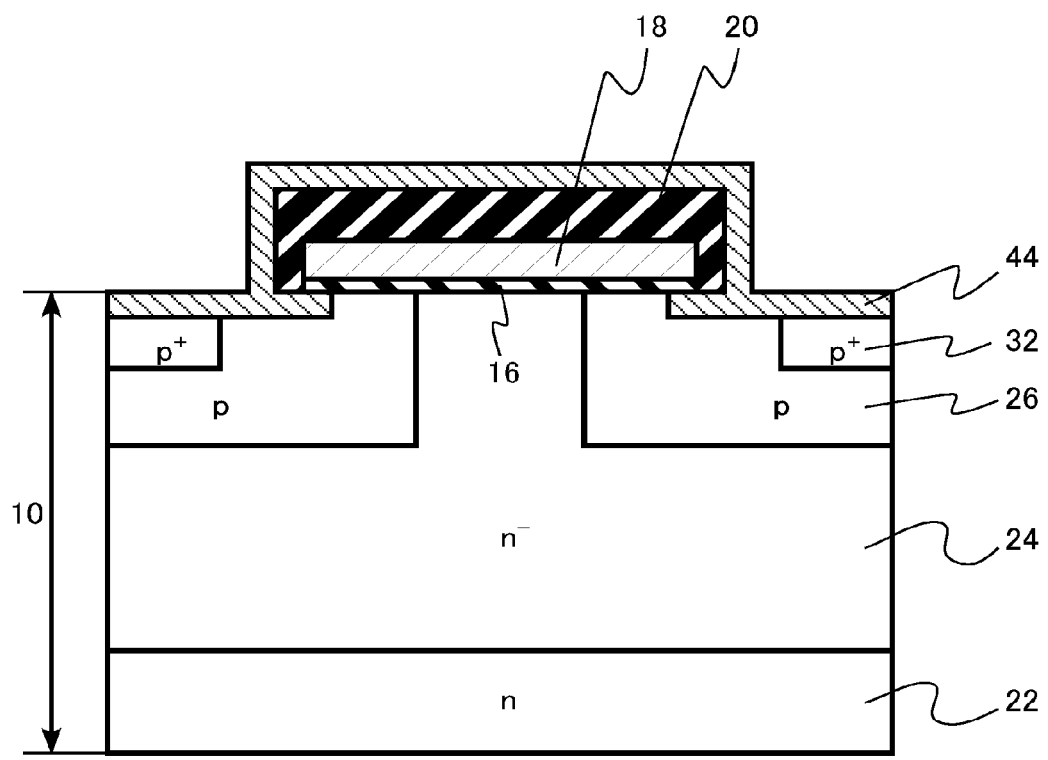
FIG. 18 is a schematic cross-sectional view of the semiconductor device in manufacturing according to the third embodiment.
Figure 19:
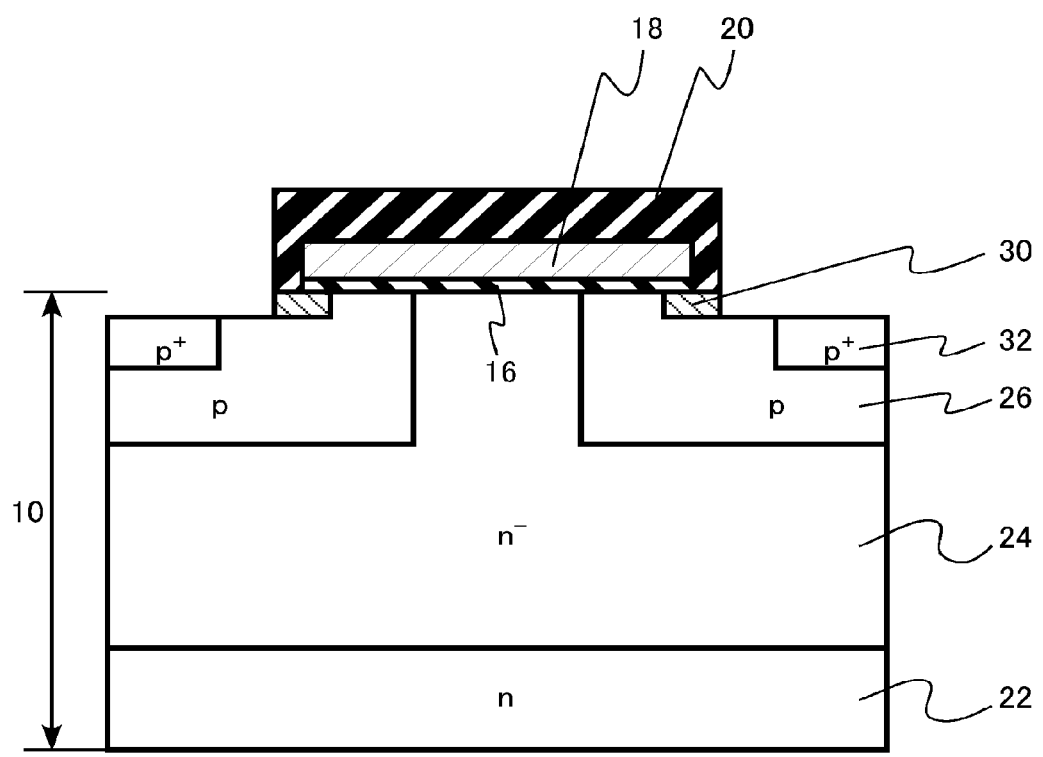
FIG. 19 is a schematic cross-sectional view of the semiconductor device in manufacturing according to the third embodiment.
Figure 20:
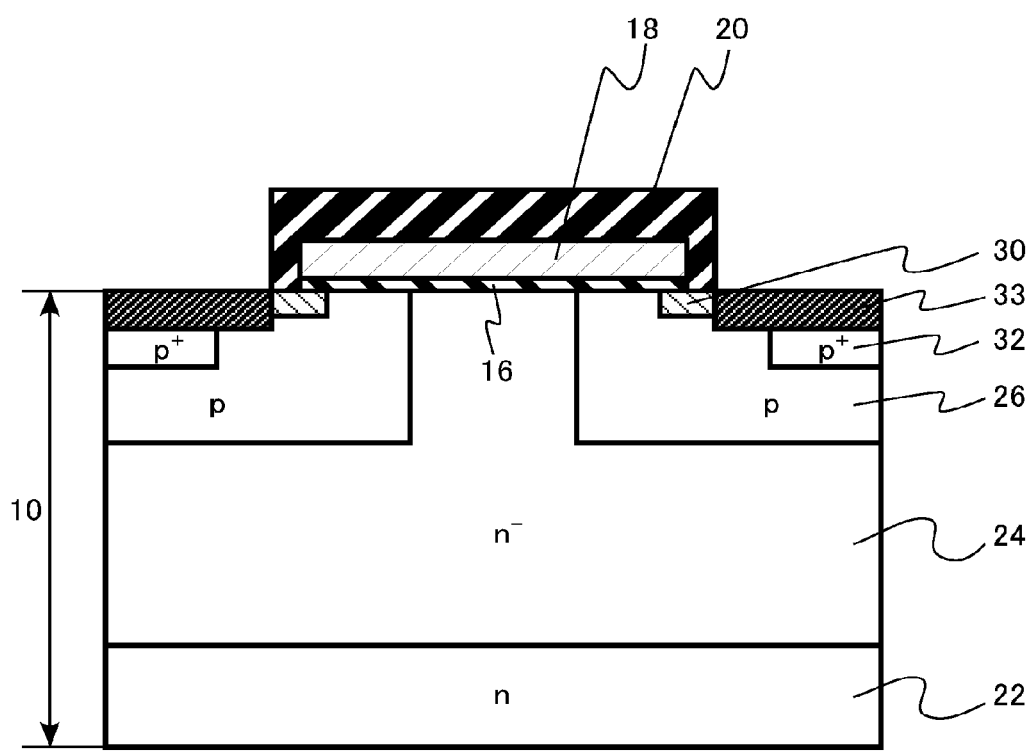
FIG. 20 is a schematic cross-sectional view of the semiconductor device in manufacturing according to the third embodiment.

Next, a metal oxide film 44 is formed on the front surface of the SiC layer 10 (refer to FIG. 18). The metal oxide film 44 is, for example, a titanium oxide containing niobium as an impurity element, and containing zirconium. The metal oxide film 44 is formed by a CVD method. In this case, the inside of the groove becomes amorphous. After that, crystallization annealing at a temperature of 600° C. to 800° C. may be performed. The film can be formed so as to be columnar in a direction of the film thickness. When a layered structure including two amorphous films or more each having a different column size, is formed, uniformity of an electrical characteristic of a film including the two polycrystalline films or more increases in a surface of the film. The layered structure including columns each having a different size, can be achieved by performing deposition a plurality of times as deposition, crystallization, deposition (in a condition at a different temperature), and crystallization in this order are performed. In this case, uniformity of electric current in the surface can be improved. Thus, the electric current that flows through a channel, becomes uniform. This point is substantially the same in the following embodiment.

Next, etching is performed to the metal oxide film 44 so as to form the source region 30 (refer to 19).

Next, the metal silicide film 33 is formed on the well contact region 32 (refer to 20). The metal silicide film 33 is, for example, a nickel silicide (NiSi). The metal silicide film 33 is formed by, for example, deposition of a metal film by a sputtering method, silicide processing of the metal film by annealing, and detachment of an unreacted metal film by wet etching.

Next, the source electrode 12 is formed on the source region 30 and the metal silicide film 33. The source electrode 12 is formed by, for example, sputtering using aluminum (Al).

Next, a drain electrode 14 is formed on a back surface of the SiC layer 10. The drain electrode 14 is, for example, a nickel silicide (NiSi) and is formed by sputtering using nickel, and heat treatment.

Figure 10:
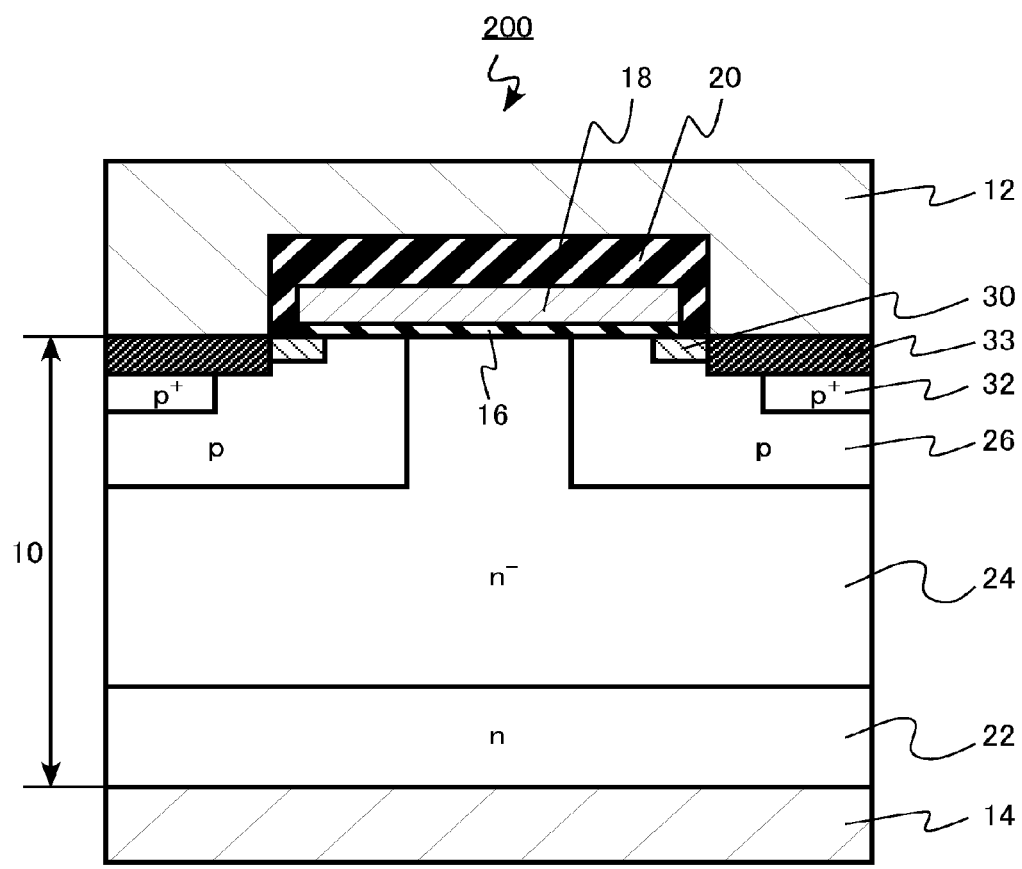
FIG. 10 is a schematic cross-sectional view of a semiconductor device according to a third embodiment.
Figure 11:
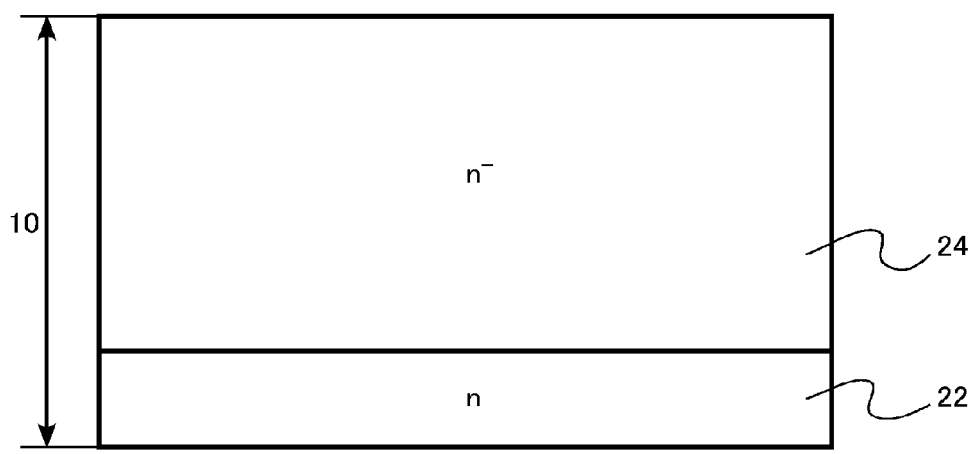
FIG. 11 is a schematic cross-sectional view of the semiconductor device in manufacturing according to the third embodiment.
Figure 12:
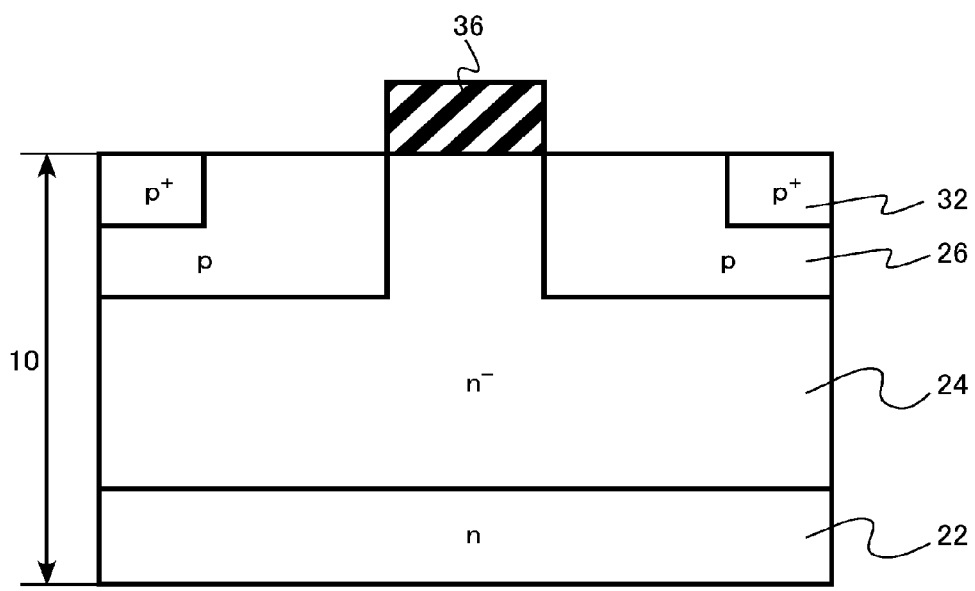
FIG. 12 is a schematic cross-sectional view of the semiconductor device in manufacturing according to the third embodiment.

The MOSFET 200 illustrated in FIG. 10 is formed by the above manufacturing method.

According to the present embodiment, the metal oxide that has been metalized is applied to the source region 30. Thus, the minute and high-performance n-type SiC Schottky junction MOSFET 200 can be achieved in a manner similar to the first embodiment.

The manufacturing method according to the present embodiment, forms a p-n junction between the drift region 24 and the well region 26 directly below the gate electrode 18, and an end portion of the source 30 directly below the gate electrode 18, by self-alignment. Therefore, controllability of a channel length of the MOSFET 200 is improved. Thus, the minute n-type SiC Schottky junction MOSFET 200 can be easily manufactured.

Fourth Embodiment

A semiconductor device according to the present embodiment has a point that a source region contains at least one metal element selected from the group consisting of calcium (Ca), strontium (Sr), and barium (Ba), and another point that an element contained in the source region is different from that according to the third embodiment. Except the two points, the semiconductor device according to the present embodiment is similar to that according to the third embodiment. Therefore, the descriptions of details that duplicate with respect to the third embodiment, will be omitted. In addition, the descriptions of details that duplicate with respect to the first and second embodiments will be omitted, the details including the configuration and the function of the source region.

The semiconductor device according to the present embodiment is a MOSFET. The MOSFET according to the present embodiment will be described with reference to FIG. 10.

A source region 30 contains at least one metal element selected from the group consisting of calcium (Ca), strontium (Sr), and barium (Ba). The source region 30 also contains titanium (Ti) and oxygen (O). The source region 30 also contains zirconium (Zr) or hafnium (Hf). The source region 30 also contains at least one impurity element selected from the group consisting of vanadium (V), niobium (Nb), tantalum (Ta), scandium (Sc), yttrium (Y), and a lanthanoid.

The source region 30 is a metal oxide that has been metalized. The source region 30 is, for example, calcium titanate, strontium titanate, barium titanate, or a composite thereof. The source region 30 is, for example, (Ca, Sr, Ba)(Ti, Zr, Hf)O$_3$ having a perovskite structure. The source region 30 is polycrystalline or amorphous.

The source region 30 is a PTCR. The source region 30 preferably contains lead (Pb). Causing the calcium titanate, the strontium titanate, the barium titanate, and the composite thereof to contain the lead (Pb), can shift a region having a positive temperature coefficient to the high temperature side.

As described above, according to the present embodiment, the metal oxide that has been metalized is applied to the source region 30. Thus, the minute and high-performance n-type SiC Schottky junction MOSFET can be achieved in a manner similar to the third embodiment. Furthermore, since the source region 30 is the PTCR, destruction of the MOSFET due to the excessive current is inhibited.

Fifth Embodiment

A semiconductor device according to the present embodiment is different from that according to the first embodiment in that the semiconductor device according to the present embodiment includes a MOSFET having a trench gate structure. The descriptions of details that duplicate with respect to the first embodiment, will be omitted below.

Figure 21:
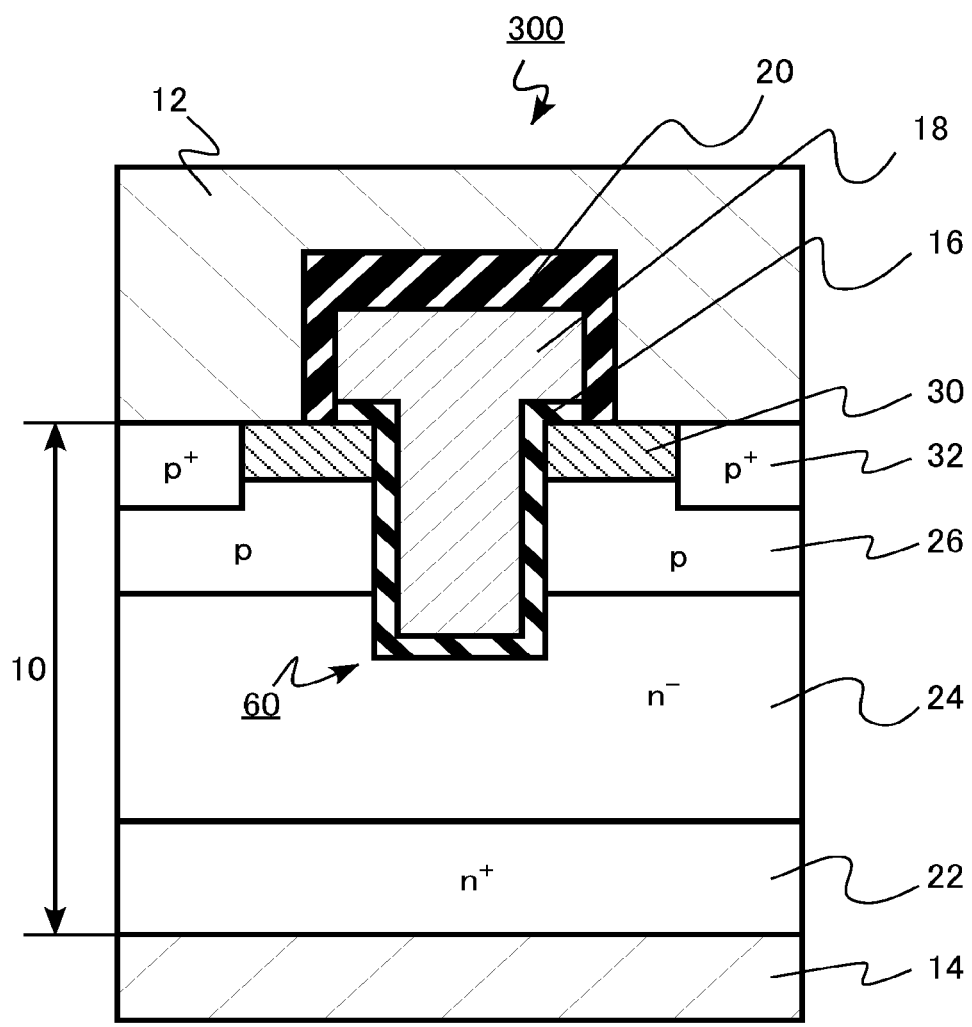
FIG. 21 is a schematic cross-sectional view of a semiconductor device according to a fifth embodiment.

FIG. 21 is a schematic cross-sectional view of the configuration of the MOSFET that is the semiconductor device according to the present embodiment. The MOSFET 300 includes the trench gate structure in which a gate electrode is provided in a trench.

The MOSFET 300 includes an SiC layer 10, a source electrode 12, a drain electrode 14, a gate insulating layer 16, the gate electrode 18, and an interlayer insulating layer 20. The SiC layer 10 includes a drain region 22, a drift region (n-type first SiC region) 24, a well region (p-type second SiC region) 26, a source region (conductive region) 30, and a well contact region 32.

The gate insulating layer 16 and the gate electrode 18 are formed in the trench 60 provided in the SiC layer 10.

The source region 30 is provided in the well region 26. The source region 30 contains titanium (Ti) and oxygen (O). The source region 30 also contains zirconium (Zr) or hafnium (Hf). The source region 30 also contains at least one impurity element selected from the group consisting of vanadium (V), niobium (Nb), and tantalum (Ta).

The source region 30 is a metal oxide that has been metalized. The source region 30 is, for example, a titanium oxide. The source region 30 is, for example, (Ti, Zr, Hf)O$_2$. The source region 30 is polycrystalline or amorphous.

According to the present embodiment, the metal oxide that has been metalized is applied to the source region 30. Thus, the minute and high-performance n-type SiC Schottky junction MOSFET 300 can be achieved in a manner similar to the first embodiment. Furthermore, applying the trench gate structure achieves the MOSFET 300 having large on-state current.

Sixth Embodiment

A semiconductor device according to the present embodiment has a point that a source region contains at least one metal element selected from the group consisting of calcium (Ca), strontium (Sr), and barium (Ba), and another point that an element contained in the source region is different from that according to the fifth embodiment. Except the two points, the semiconductor device according to the present embodiment is similar to that according to the fifth embodiment. Therefore, the descriptions of details that duplicate with respect to the fifth embodiment, will be omitted. In addition, the descriptions of details that duplicate with respect to the first and second embodiments will be omitted, the details including the configuration and the function of the source region.

The semiconductor device according to the present embodiment is a MOSFET. The MOSFET according to the present embodiment will be described with reference to FIG. 21.

A source region 30 contains at least one metal element selected from the group consisting of calcium (Ca), strontium (Sr), and barium (Ba). The source region 30 also contains titanium (Ti) and oxygen (O). The source region 30 also contains zirconium (Zr) or hafnium (Hf). The source region 30 also contains at least one impurity element selected from the group consisting of vanadium (V), niobium (Nb), tantalum (Ta), scandium (Sc), yttrium (Y), and a lanthanoid.

The source region 30 is a metal oxide that has been metalized. The source region 30 is, for example, calcium titanate, strontium titanate, barium titanate, or a composite thereof. The source region 30 is, for example, (Ca, Sr, Ba)(Ti, Zr, Hf)O$_3$ having a perovskite structure. The source region 30 is polycrystalline or amorphous.

The source region 30 is a PTCR. The source region 30 preferably contains lead (Pb). Causing the calcium titanate, the strontium titanate, the barium titanate, and the composite thereof to contain the lead (Pb), can shift a region having the positive temperature coefficient to the high temperature side.

As described above, according to the present embodiment, the metal oxide that has been metalized is applied to the source region 30. Thus, the minute and high-performance n-type SiC Schottky junction MOSFET can be achieved in a manner similar to the fifth embodiment. Applying the trench gate structure achieves the MOSFET having large on-state current in a manner similar to the fifth embodiment. Furthermore, since the source region 30 is the PTCR, the destruction of the MOSFET due to the excessive current is inhibited.

Seventh Embodiment

A semiconductor device according to the present embodiment is different from that according to the first embodiment in that the semiconductor device according to the present embodiment is an insulated gate bipolar transistor (IGBT). The descriptions of details that duplicate with respect to the first embodiment, will be omitted.

Figure 22:
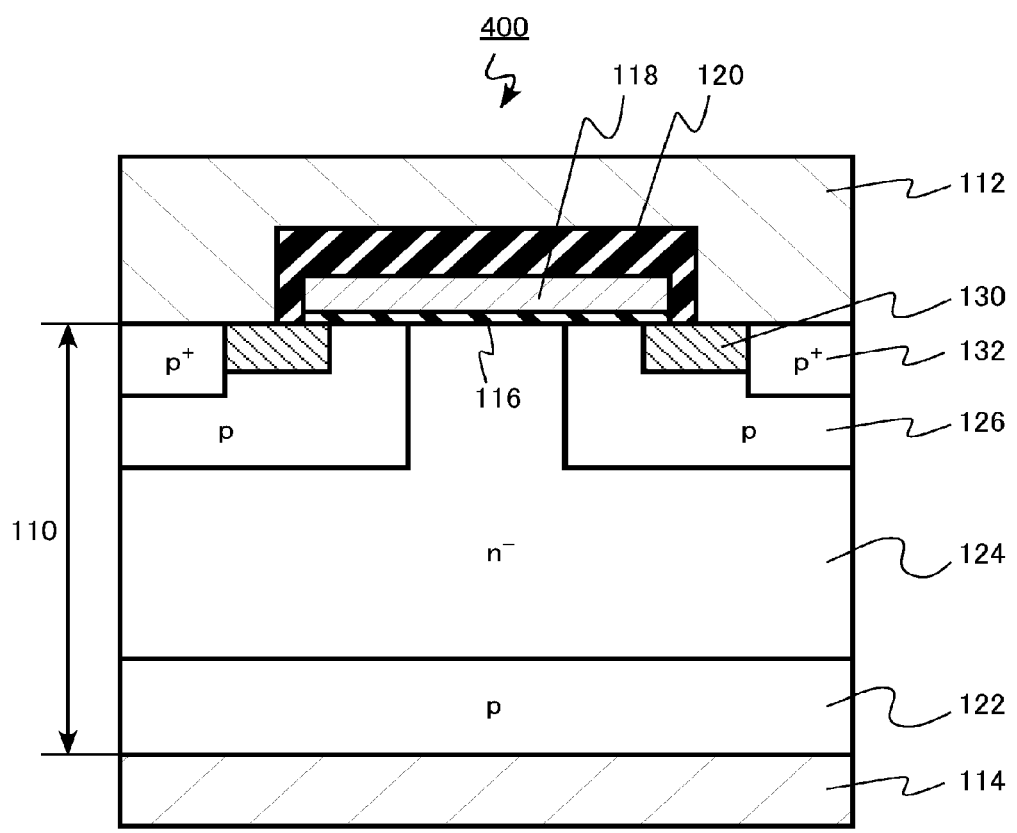
FIG. 22 is a schematic cross-sectional view of a semiconductor device according to a seventh embodiment.

FIG. 22 is a schematic cross-sectional view of a configuration of an IGBT that is the semiconductor device according to the present embodiment.

The IGBT 400 includes an SiC layer 110, an emitter electrode 112, a collector electrode 114, a gate insulating layer 116, a gate electrode 118, and an interlayer insulating film 120. The SiC layer 110 includes a collector region 122, a drift region (n-type first SiC region) 124, a base region (p-type second SiC region) 126, an emitter region (conductive region) 130, and a base contact region (p-type third SiC region) 132.

The SiC layer 110 is SiC having a crystal structure of 4H-SiC. The 4H-SiC is a hexagonal crystal system.

The SiC layer 110 has a first plane and a second plane. In FIG. 1, the first plane is a plane on the upper side of the figure. The second plane is a plane on the lower side of the figure. Hereinafter, the first plane is referred to as a front surface. The second plane is referred to as a back surface.

A case where the first plane has slanted at an angle of 0 to 8 degrees to a (0001) face and the second plane has slanted at an angle of 0 to 8 degrees to a (000-1) face, will be described as an example. The (0001) face is referred to as a silicon face. The (000-1) face is referred to as a carbon face.

The collector region 122 is p-type SiC. The collector region 122 contains, for example, aluminum (Al) as a p-type impurity. Concentration of the p-type impurity in the collector region 122 is in a range from $1\times10^{18}$ cm$^{-3}$ to $1\times10^{21}$ cm$^{-3}$.

The drift region 124 is provided on the collector region 122. The drift region 124 is, for example, n⁻-type SiC formed on the collector region 122 by epitaxial growth. The thickness of the drift region 124 is, for example, in a range from 5 μm to 150 μm.

The drift region 124 contains, for example, nitrogen (N) as an n-type impurity. Concentration of the n-type impurity in the drift region 24 is, for example, in a range from $5\times10^{15}$ cm$^{-3}$ to $2\times10^{16}$ cm$^{-3}$.

The base region 126 is provided on the drift region 124. The base region 126 is p-type SiC. The base region 126 is provided between the emitter region 130 and the drift region 124. The base region 126 functions as a channel region of the IGBT 400.

The base region 126 contains, for example, aluminum (Al) as a p-type impurity. Concentration of the p-type impurity in the base region 126 is in a range from $5\times10^{15}$ cm$^{-3}$ to $1\times10^{17}$ cm$^{-3}$. The depth of the base region 126 is, for example, in a range from 0.4 μm to 0.8 μm.

The emitter region 130 is provided in the base region 126. The emitter region 130 contains titanium (Ti) and oxygen (O). The emitter region 130 also contains zirconium (Zr) or hafnium (Hf). The emitter region 130 also contains at least one impurity element selected from the group consisting of vanadium (V), niobium (Nb), and tantalum (Ta).

The emitter region 130 is a metal oxide that has been metalized. The emitter region 130 is, for example, a titanium oxide. The emitter region 130 is, for example, (Ti, Zr, Hf)O$_2$. The emitter region 130 is polycrystalline or amorphous.

An atomic ratio of the titanium to the sum of the titanium, the zirconium, and the hafnium in the emitter region 130 (Ti/(Ti+Zr+Hf)) is preferably in a range from 0.5 to 0.8, more preferably, in a range from 0.6 to 0.7.

Adding the impurity element to the metal oxide causes the metal oxide to include conductivity. For example, the titanium (Ti), the zirconium (Zr), or the hafnium (Hf) is substituted. The vanadium (V), the niobium (Nb), or the tantalum (Ta) to be an n-type impurity is added to the metal oxide. As a result, the metal oxide has n-type conductivity in which an electron serves as a carrier.

Concentration of the impurity element in the emitter region 130 is, for example, in a range from $1\times10^{18}$ cm$^{-3}$ to $1\times10^{21}$ cm$^{-3}$. In terms of metallization of the emitter region 130, the concentration of the impurity element in the emitter region 130 is preferably $1\times10^{19}$ cm$^{-3}$ or more, more preferably, $1\times10^{20}$ cm$^{-3}$ or more.

A type of the element, an amount of the element, an atomic ratio of the element contained in the emitter region 130 can be identified by secondary ion mass spectrometry (SIMS).

The depth of the emitter region 130 (film thickness) is shallower than that of the base region 126, and is, for example, in a range from 0.02 μm to 0.1 μm. The depth of the emitter region 130 (film thickness) is shallower than that of the base contact region 132.

The base contact region 132 is provided in the base region 126. The base contact region 132 is provided on the side of the emitter region 130.

The base contact region 132 is p⁺-type SiC. The base contact region 132 contains, for example, aluminum (Al) as a p-type impurity. Concentration of the p-type impurity in the base contact region 132 is, for example, in a range from $1\times10^{18}$ cm$^{-3}$ to $1\times10^{21}$ cm$^{-3}$.

The depth of the base contact region 132 is shallower than that of the base region 126, and is, for example, in a range from 0.2 μm to 0.4 μm. The depth of the base contact region 132 is deeper than that of the emitter region 130.

The gate insulating layer 116 is formed on the emitter region 130, the base region 126, and the drift region 24. The gate insulating layer 116 is formed between the emitter region 130, the base region 126, the drift region 24, and the gate electrode 118. For example, a silicon oxide film or a high-k insulating film can be applied to the gate insulating layer 116.

The gate electrode 118 is provided on the gate insulating layer 116. For example, polycrystalline silicon doped with an impurity can be applied to the gate electrode 118. For example, a metal semiconductor compound or a metal can be also applied to the gate electrode 118.

The interlayer insulating film 120 is provided on the gate electrode 118. The interlayer insulating film 120 is, for example, a silicon oxide film.

The base region 126 interposed between the emitter region 130 and the drift region 124 below the gate electrode 118, functions as a channel region of the IGBT 400.

The emitter electrode 112 is provided on the front surface of the SiC layer 110. The emitter electrode 112 is electrically coupled to the emitter region 130 and the base contact region 132. The emitter electrode 112 is in contact with the base contact region 132 and the emitter region 130. The emitter electrode 112 has a function for applying potential to the base region 126.

The emitter electrode 112 is a metal. The metal that forms the emitter electrode 112 has a layered structure including titanium (Ti) and aluminum (Al). The metal that forms the emitter electrode 112 may react with the SiC layer 110 so as to form a metal silicide or a metal carbide.

The collector electrode 114 is provided on the back surface of the SiC layer 110. The collector electrode 114 is electrically coupled to the collector region 122.

The collector electrode 114 is a metal. The metal that forms the collector electrode 114 is, for example, a nickel-aluminum alloy (NiAl).

According to the present embodiment, the metal oxide that has been metalized is applied to the emitter region 130. Due to the function similar to that according to the first embodiment, the minute and high-performance n-type SiC Schottky junction IGBT 400 can be achieved.

Eighth Embodiment

A semiconductor device according to the present embodiment has a point that an emitter region contains at least one metal element selected from the group consisting of calcium (Ca), strontium (Sr), and barium (Ba), and another point that an impurity element contained in the emitter region is different from that according to the seventh embodiment. Except the two points, the semiconductor device according to the present embodiment is similar to that according to the seventh embodiment. Therefore, the descriptions of details that duplicate with respect to the seventh embodiment, will be omitted. In addition, the descriptions of details that duplicate with respect to the first and second embodiments will be omitted, the details including the configuration and the function of the emitter region.

The semiconductor device according to the present embodiment is an IGBT. The IGBT according to the present embodiment will be described with reference to FIG. 22.

The emitter region 130 contains at least one metal element selected from the group consisting of the calcium (Ca), the strontium (Sr), and barium (Ba). The emitter region 130 also contains titanium (Ti) and oxygen (O). The emitter region 130 also contains zirconium (Zr) or hafnium (Hf). The emitter region 130 also at least one impurity element selected from the group consisting of vanadium (V), niobium (Nb), tantalum (Ta), scandium (Sc), yttrium (Y), and a lanthanoid.

The emitter region 130 is a metal oxide that has been metalized. The emitter region 130 is, for example, calcium titanate, strontium titanate, barium titanate, or a composite thereof. The emitter region 130 is, for example, (Ca, Sr, Ba)(Ti, Zr, Hf)$O_3$ having a perovskite structure. The emitter region 130 is polycrystalline or amorphous.

The emitter region 130 is a PTCR. The emitter region 130 preferably contains lead (Pb). Causing the calcium titanate, the strontium titanate, the barium titanate, and the composite thereof to contain the lead (Pb), can shift a region having the positive temperature coefficient to the high temperature side.

As described above, according to the present embodiment, the metal oxide that has been metalized is applied to the emitter region 130. Thus, the minute and high-performance n-type SiC Schottky junction IGBT can be achieved in a manner similar to the seventh embodiment. Furthermore, since the emitter region 130 is the PTCR, destruction of the IGBT due to excessive current is inhibited.

According to at least one of the semiconductor devices of the embodiments that have been described above, the metal oxide having electron affinity that has been decreased by adding zirconium (Zr) or hafnium (Hf) to the titanium oxide, is used. Therefore, scaling-down of a transistor can be achieved.

According to the first to eighth embodiments, the nitrogen (N) has been exemplified as the n-type impurity. Instead of the nitrogen (N), for example, phosphorus (P), arsenic (As), or antimony (Sb) can be applied. The aluminum (Al) has been exemplified as the p-type impurity. Instead of the aluminum (Al), for example, boron (B), gallium (Ga), or indium (In) can be applied.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
    a conductive region including titanium (Ti), oxygen (O), at least one first element from zirconium (Zr) and hafnium (Hf), and at least one second element from vanadium (V), niobium (Nb), and tantalum (Ta);
    an n-type first SiC region and a p-type second SiC region, the p-type second SiC region being provided between the conductive region and the n-type first SiC region;
    a gate electrode provided over the conductive region, the n-type first SiC region and the p-type second SiC region; and
    a gate insulating layer provided between the gate electrode and each of the conductive region, the p-type second SiC region, and the n-type first SiC region.

2. The device according to claim 1,
    wherein an atomic ratio of the titanium to sum of the titanium, the zirconium, and the hafnium in the conductive region (Ti/(Ti+Zr+Hf)) is 0.8 or less.

3. The device according to claim 2,
    wherein the atomic ratio of the titanium to sum of the titanium, the zirconium, and the hafnium in the conductive region (Ti/(Ti+Zr+Hf)) is 0.5 or more.

4. The device according to claim 1,
    wherein concentration of the at least one second element in the conductive region is $1 \times 10^{19}$ cm$^{-3}$ or more.

5. The device according to claim 1,
    wherein the conductive region includes a metal oxide.

6. The device according to claim 1,
    wherein concentration of a p-type impurity in the p-type second SiC region is $1 \times 10^{17}$ cm$^{-3}$ or less.

7. The device according to claim 1, further comprising a p-type third SiC region, the p-type third SiC region provided beside the conductive region in the p-type second SiC region, the third p-type SiC region having concentration of a p-type impurity higher than concentration of a p-type impurity in the p-type second SiC region, and deeper than the conductive region.

8. A semiconductor device comprising:
    a conductive region including titanium (Ti), oxygen (O), at least one first element from zirconium (Zr) and hafnium (Hf), at least one metal element from calcium (Ca), strontium (Sr), and barium (Ba), and at least one second element from vanadium (V), niobium (Nb), tantalum (Ta), scandium (Sc), yttrium (Y), and lanthanoid;
    an n-type first SiC region and a p-type second SiC region being provided between the conductive region and the n-type first SiC region;
    a gate electrode provided over the conductive region, the n-type first SiC region and the p-type second SiC region; and
    a gate insulating layer provided between the gate electrode and each of the conductive region, the p-type second SiC region, and the N-type first SiC region.

9. The device according to claim 8,
    wherein an atomic ratio of the titanium to sum of the titanium, the zirconium, and hafnium in the conductive region (Ti/(Ti+Zr+Hf)) is 0.8 or less.

10. The device according to claim 9,
    wherein the atomic ratio of the titanium to sum of the titanium, the zirconium, and hafnium in the conductive region (Ti/(Ti+Zr+Hf)) is 0.5 or more.

11. The device according to claim 8,
    wherein concentration of the at least one second element in the conductive region is $1 \times 10^{19}$ cm$^{-3}$ or more.

12. The device according to claim 8,
wherein the conductive region includes a metal oxide.

13. The device according to claim 8,
wherein the conductive region includes calcium titanate, strontium titanate, or barium titanate.

14. The device according to claim 8,
wherein concentration of a p-type impurity of the p-type second SiC region is $1\times10^{17}$ cm$^{-3}$ or less.

15. The device according to claim 8,
wherein the conductive region contains lead (Pb).

16. The device according to claim 8,
wherein temperature dependence of electric resistance of the conductive region changes from negative dependence to positive dependence at a temperature of 150° C. to 200° C.

17. The device according to claim 8, further comprising a p-type third SiC region, the p-type third SiC region provided beside the conductive region in the p-type second SiC region, the third p-type SiC region having concentration of a p-type impurity higher than concentration of a p-type impurity in the p-type second SiC region, and deeper than the conductive region.

\* \* \* \* \*